United States Patent
Kanarov et al.

(10) Patent No.: US 7,183,716 B2
(45) Date of Patent: Feb. 27, 2007

(54) CHARGED PARTICLE SOURCE AND OPERATION THEREOF

(75) Inventors: Viktor Kanarov, Bellmore, NY (US); Alan V. Hayes, Centerport, NY (US); Rustam Yevtukhov, Briarwood, NY (US); Ira Reiss, New City, NY (US); Roger P. Fremgen, Jr., Northport, NY (US); Adrian Celaru, Massapequa, NY (US); Kurt E. Williams, Seaford, NY (US); Carlos Fernando de Mello Borges, Central Islip, NY (US); Boris L. Druz, Brooklyn, NY (US); Renga Rajan, Dix Hills, NY (US); Hari Hegde, Little Neck, NY (US)

(73) Assignee: Veeco Instruments, Inc., Woodbury, NY (US)

( * ) Notice: Subject to any disclaimer, the term of this patent is extended or adjusted under 35 U.S.C. 154(b) by 0 days.

(21) Appl. No.: 10/772,132

(22) Filed: Feb. 4, 2004

(65) Prior Publication Data

US 2004/0163766 A1    Aug. 26, 2004

Related U.S. Application Data

(60) Provisional application No. 60/444,731, filed on Feb. 4, 2003.

(51) Int. Cl.
*H01J 7/24* (2006.01)

(52) U.S. Cl. .......................... 315/111.51; 156/345.49; 118/723 I

(58) Field of Classification Search ........... 315/111.51, 315/111.41, 111.21; 156/345.49, 345.48; 118/723 I, 723 R
See application file for complete search history.

(56) References Cited

U.S. PATENT DOCUMENTS

| 3,969,646 A | | 7/1976 | Reader et al. ............... 313/359 |
| 4,481,062 A | | 11/1984 | Kaufman et al. ........... 156/345 |
| 5,036,252 A | | 7/1991 | Lob ...................... 315/111.31 |
| 5,198,718 A | | 3/1993 | Davis et al. ............. 313/359.1 |
| 5,309,063 A | * | 5/1994 | Singh .................... 315/111.21 |

(Continued)

*Primary Examiner*—Tuyet Vo
*Assistant Examiner*—Ephrem Alemu
(74) *Attorney, Agent, or Firm*—Wood, Herron & Evans, LLP

(57) ABSTRACT

A charged particle source utilizes a novel plasma processing chamber, RF coil and ion optics, to achieve high uniformity. The plasma processing chamber has a re-entrant vessel which is movable, and which includes extensions of adjustable shape or position, to make more uniform the plasma contained within the chamber. One or more magnets, which may be static or moving, may be included within the re-entrant vessel. The ion optics include a grid with a number of apertures, and tuning features each surrounding an aperture. These tuning features either reduce the diameter of the associated aperture, or increase the length of that aperture, to create more uniform beamlets emerging from the grid. The RF coil includes a flux concentrator positioned adjacent to the winding in at least one angular region thereof to tune the magnetic field produced thereby.

8 Claims, 14 Drawing Sheets

U.S. PATENT DOCUMENTS

| | | | |
|---|---|---|---|
| 5,391,281 A | 2/1995 | Hieronymi et al. | 204/298.37 |
| 5,569,363 A | 10/1996 | Bayer et al. | 204/192.32 |
| 5,969,470 A | 10/1999 | Druz et al. | 313/359.1 |
| 5,997,686 A | 12/1999 | Lardon et al. | 156/345 |
| 6,162,323 A * | 12/2000 | Koshimizu | 156/345.26 |
| 6,225,747 B1 | 5/2001 | Fremgen, Jr. et al. | 315/111.91 |
| 6,259,209 B1 * | 7/2001 | Bhardwaj et al. | 156/345.12 |
| 6,289,842 B1 * | 9/2001 | Tompa | 118/723 E |
| 6,417,626 B1 * | 7/2002 | Brcka et al. | 315/111.51 |
| 6,451,161 B1 * | 9/2002 | Jeng et al. | 156/345.48 |

* cited by examiner

13.8" plasma diameter ion source (Prior Art)
- Average optimized within-wafer rotated uniformity:   3% 3σ/mean
- Average within-wafer static uniformity:   8 - 16% 3σ/mean

13.8" plasma diameter ion source with modified ion optics (Prior Art)
- Average optimized within-wafer rotated uniformity:   2 - 3% 3σ/mean
- Average within-wafer static uniformity:   6 - 12% 3σ/mean

14.5" Ion source with Low Divergence Grid Ass'y, RV Extender, and Micromasks
- Average optimized within-wafer rotated uniformity:   1 - 3% 3σ/mean
- Average within wafer-static uniformity:   4% 3σ/mean

14.5" Ion source with Low Divergence Grid Ass'y and Rotating Magnet Array
- Average optimized within-wafer rotated uniformity:   1 - 1.8% 3σ/mean
- Average within wafer-static uniformity:   3% 3σ/mean

FIG. 8

| Source Type | Center Divergence Angle | Change in Divergence from center to 3" | Steering Angle for 6" wafer |
|---|---|---|---|
| 350 mm Production Source (PRIOR ART) | 7.7 | 0.8 | 1.5 |
| 350 mm Production Source with Modified Ion Optics (PRIOR ART) | 5.3 | 0.5 | 1 |
| 450 mm Source with Low Divergence Grid Ass'y, RV extender and grid micromasks | 2.4 | 0.5 | 0.5 |
| 450 mm Source with Low Divergence Grid Ass'y and Rotating Magnet Array | 2.6 | 0.6 | 0.5 |

FIG. 9

CHARGED PARTICLE SOURCE AND OPERATION THEREOF

CROSS REFERENCE TO RELATED APPLICATIONS

The present application claims benefit of U.S. provisional application Ser. No. 60/444,731, filed Feb. 4, 2003, the disclosure of which is hereby incorporated herein by reference in its entirety.

FIELD OF THE INVENTION

The present invention relates to charge particle sources such as are used for treatment of a substrate.

BACKGROUND OF THE INVENTION

Charged particle treatment of substrates is used in a variety of applications. One specific application is ion beam etching of substrates having features with extreme critical dimension uniformity and symmetry requirements, in particular, "pole trimming" and "pole slimming" processes used in formation of a thin film magnetic head for a disk drive. In such processes, the substrate, depending on the particular application, is positioned at one or more angles to the beam, between normal incidence (0°) and glancing incidence (e.g. about 70°). Depending on the application, the substrate may be required to be held statically at one or more fixed angle(s), or may be moved in front of the beam (e.g. tilted and/or rotated) during a single substrate process cycle to improve the substrate treatment uniformity.

Shortcomings in present charged particle sources will limit the use of such processes. The reduction of critical dimensions of thin film devices, according to the general trend of semiconductor and data storage device miniaturization, has increased the need for process uniformity, and better control of beam collimation. At the same time, reduction in device size has required better control of device critical dimensions ("CD"s) that are a function of the ion bombardment process, such as the average wall angle of an etched structure. Equally important, variations in these CDs need to be better controlled.

As a result, for modem, critical applications, very high process uniformity (e.g. etch depth) may be required, to within 1 to 3%. Uniformity, however, is directly related to the particle flux, i.e. the beam current density, profile, and the angular distribution of the charged particles at the substrate is directly related to the angular properties of the beamlets extracted from the plasma by the optics of the source. These requirements dictate that the angular impact of the particles across the substrate should be, with very small tolerance, in exactly the same direction, with small and uniform local angular spread, and the flux of these particles (plus the charged particles converted to energetic neutrals during the beam transport) to the substrate should be at the same time very uniform. For the charged particle beam, this translates to a more directional, parallel, and simultaneously more uniform current density broad beam. For example, an ion beam treatment system is required in which the average ion divergence angle is <3 to 5°, and both the beam divergence angle and beam parallelism are controlled within <0.5 to 1° deviation.

At the same time, there is a need for improved "static etch" charged particle treatment processes, in which a substrate is held at a fixed angle with respect to the beam and must therefore be uniformly treated over a large volume of beam space. Large area static etch applications have been developed relatively recently, driven by special needs such as ion beam "pole tip thinning" of thin film magnetic heads. In these processes, the substrate cannot be rotated or moved to "average out" variations in the ion flux across a substrate. Since the substrate may be held at a steep angle to the ion beam, the ion flux must be uniform in the entire three-dimensional space containing the substrate surface. Although prior designs seek to control process uniformity, divergence angle and parallelism, current charged particle sources can usually only be optimized for one of these parameters, by compromising another.

For example, some known techniques for achieving highly uniform particle flux processes use conventional plasma-driven particle sources combined with substrate motion (such as planetary motion) to average out variations in the beam flux uniformity; these techniques do not provide sufficient control of the directionality, parallelism, or uniformity of the angular distribution of ion incidence across the substrate surface, but rather, for practically limited beam dimensions, tend to aggravate these problems by moving the substrate outside of the most parallel region of the beam.

Another known approach to improved particle flux uniformity in a charged particle processing system, is to form charged particle beamlets in a certain pattern by specific design of the charged particle optical system used to extract the charged particles from the generator, said optical system, for example, comprising a set of electrodes having multiple extraction apertures, the location, size and density of which can be adjusted across the beam extraction area. Such a grid assembly, operated under proper conditions, is also capable of achieving the desired device features across small areas of a substrate. However, the beam flux uniformity and charged particle angular distributions generated by conventional grid assemblies have unacceptable variations, due to variations in mechanical tolerances of the grid assembly and thermal expansion effects under service conditions. Furthermore, a low beam divergence charged particleoptic design does not compensate for variations in the charged particle generator, which can themselves affect the beam collimation and uniformity. In fact, low beam divergence requirements result in greater sensitivity of the beam profile on the substrate to variations in the particle source, since beam divergence tends to average out such variations downstream from the ion source.

Thus, advanced charged particle designs having very tight control of grid structure dimensions, and thermal expansion effects, when combined with a conventional particle generator, are still not able to meet the divergence uniformity requirements or beam parallelism at the substrate across large diameters, due to limitations of the generator.

As mentioned above, it is known in the art that the charged particle flux uniformity, beamlet directionality, and beam divergence uniformity can be partially controlled by the design of the gridded optics. By patterning the individual grid hole sizes or hole density in different zones across the grid area, for example, the beam current density uniformity can be improved. However, there are practical limitations to the efficacy of these techniques. One is that changes in one zone, can, due to beam divergence, affect other areas of the substrate not directly within the same zone. Also, the effectiveness is lost if very small changes on the orders of the mechanical tolerances are required. Furthermore, the procedures which have been used in the past for practical beam etching systems, commonly known as "masking", "zoning" or "blocking" techniques, were specifically developed for use with substrate rotation to average out azimuthal variations in beam density. These techniques are unsuited for static substrate treatment processes.

With regard to the objective of improving the plasma uniformity or ion current density uniformity across a surface within a plasma-driven particle generator, a number of attempts have been described in the literature of radio frequency (RF) Inductively Coupled Plasma (RF ICP) sources. This includes: (1) a helical rf coil design with movable re-entrant plasma shaping plug with or without accessory magnetic fields; (2) "pancake"-type planar rf coil generator designs equipped with modified geometries of the rf coil; (3) planar or domed rf coil generator designs equipped with independently controllable multiple rf coils; (4) a planar rf coil generator design equipped with magnetic-pole-confinement; (5) a helical resonator rf plasma source with optimized rf tap. Pancake-type plasma generators are not very suitable for practical ion beam sources, due to deposition of ion beam sputtered material on the "rf window" area, causing the need for frequent maintenance. The other potential solutions are complicated and expensive.

Thus, there is a need for a charged particle source for treating a substrate with reduced angular dispersion of the charged particles across a large substrate, while also maintaining high uniformity across the substrate at any angle to the beam.

A second, independent need is to improve uniformity of a charged particle treatment process. An exemplary process where this need will arise, is ion beam etching of smooth surfaces, or substrates with devices without very challenging critical dimensions, such as a seed layer etch process. There, improved uniformity of treatment can provide better device yields.

A third need is to improve processes in which the substrate is held statically at an angle during the process.

There is a further need for a charged particle source that is "tunable" to compensate for variations due to part tolerances as well as changes in source performance with time.

SUMMARY OF THE INVENTION

The charged particle beam current density profile from a plasma-driven source is directly related to the charged particle optic design, and the charged particle flux "$\phi$" directed to the optic surface within the plasma sheath formed at the surface. It is a feature of the present invention to provide a plasma source with extremely uniform particle flux $\phi$ directed to a large surface within the plasma. That surface may be the optic surface mentioned above, or another surface, such as a substrate immersed in the plasma. For convenience, principles of the invention will be described specifically with reference to an ion beam application using an ion optic surface.

In this application, the angular properties of the beamlets extracted from the plasma by an ion optical element are determined by several factors, including the shape of the plasma meniscus at the element. The angular deviation of the mean direction vector of an ion beamlet extracted from an ion optical element from the normal direction with respect to the surface of the element is defined as the "steering angle." Therefore, it is a feature of the present invention to provide a plasma meniscus shape at each optical element that is consistent with very low beam divergence, and low steering angle, and which is uniform across the usable area of the ion optic surface.

The shape of the plasma meniscus is determined in part by the local and global distribution of the plasma density "n" and the plasma potential "$V_p$" in the plasma sheath formed at the surface of the ion optics. Therefore, it is a feature of the invention to provide very uniform local and global uniformity of plasma density "n" and plasma potential $V_p$ in the plasma sheath formed at the surface of the ion optics.

The shape of the plasma meniscus also depends on the ion flux $\phi$ directed to the ion optic surface. Global uniformity of $\phi$ was already specified as an independent feature. Local uniformity of $\phi$ about each optical element is another feature. Additionally, $\phi$ is directly proportional to both n and $T_e^{1/2}$, where "$T_e$" is the electron temperature of the plasma. Therefore, to obtain a uniform plasma meniscus, in which both n and $\phi$ must be uniform, $T_e$ must also be uniform. To achieve a specific ion beam density profile optimized for a particular substrate motion, in accordance with principles of the invention, the ion flux profile in the plasma may be specifically tailored.

In a first aspect, the features of the present invention are accomplished by a plasma discharge chamber which comprises an evacuated chamber for containing a plasma which is excited by radio frequency energy from a radio frequency source, having therein a re-entrant vessel. The re-entrant vessel, which is not evacuated, is positioned within the chamber to shape and make more uniform the plasma contained within the chamber. The re-entrant vessel is movable within the chamber in at least a first direction to adjust the plasma uniformity, and furthermore the re-entrant vessel includes extensions of adjustable shape or position, which may be altered to further adjust and unify the plasma within the chamber.

In particular embodiments of this aspect, the features of the present invention are achieved by the use of one or more magnets, which may be static or moving, within the re-entrant vessel.

In a further aspect, the features of the present invention are accomplished by a ion optic grid assembly, comprising a set of one or more grid plates, the plate closest to the plasma, known as the "screen grid" having first and second surfaces and a plurality of parallel apertures extending between said first and second surfaces, and additional tuning features affixed to the plate, extending away from one of the surfaces surrounding an aperture. These tuning features either reduce the diameter of the associated aperture, or decrease or increase the length of that aperture.

In a third aspect, the features of the present invention are accomplished by a radio frequency coil for a plasma processing chamber having a winding of an electrical conductor to be driven by an RF source, and a flux concentrator positioned adjacent to the winding in at least one angular region thereof.

The above and other objects and advantages of the present invention shall be made apparent from the accompanying drawings and the description thereof.

BRIEF DESCRIPTION OF THE DRAWING

The accompanying drawings, which are incorporated in and constitute a part of this specification, illustrate embodiments of the invention and, together with a general description of the invention given above, and the detailed description of the embodiments given below, serve to explain the principles of the invention.

FIG. 8 is a table comparing etch uniformity of prior art ion sources and an ion source in accord with principles of the present invention;

FIG. 9 is a table comparing beam dispersion of prior art ion sources and an ion source in accord with principles of the present invention;

DETAILED DESCRIPTION OF SPECIFIC EMBODIMENTS

The present invention provides a charged particle source in which very low divergence beamlets are formed from particular ion optics structures of a gridded plasma-driven ion source. The source forms a broad collimated uniform beam from an array of charged particle beamlets, in which the beamlet current densities are uniform. Each beamlet has a very small angular divergence, the beamlet divergence is very uniform, and the mean direction vectors of the beamlets are very parallel across the usable area of the source. The charged particle current density profile is also optimizable for processes in which the substrate is moved in front of the beam during the process, so that the substrate motion attains a very uniform particle treatment.

Figure 1:
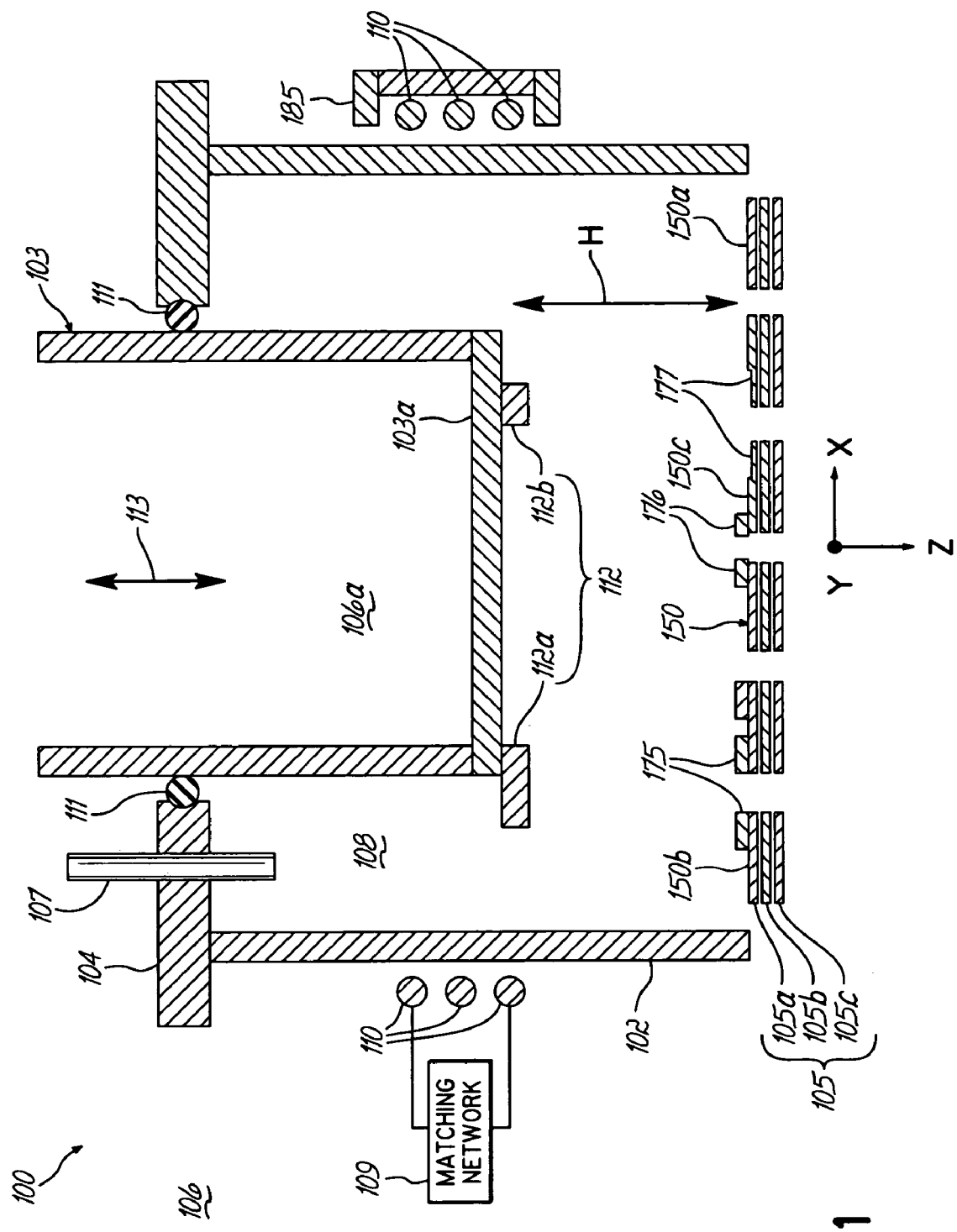
FIG. 1 is a cross-sectional view of a cylindrical chamber in accordance with a first embodiment in accord with principles of the present invention.

Referring to FIG. 1: The ion source described by our invention, 100, consists of a radio frequency (rf) Inductively coupled Plasma (RF ICP) discharge chamber and ion optic assembly mountable to a high vacuum substrate processing chamber. In the embodiment shown, the plasma discharge chamber is defined by the outer dielectric cylinder 102, the inner cylinder 103 with closed end 103a, herein referred to as the "re-entrant vessel" and the back plate 104. A multi-aperture grid assembly, the "ion optics" 105, is situated on the open end of the plasma discharge chamber. It is used to extract a beam of ions from the ion source plasma and transport said beam to the process chamber. A low beam divergence ion optic design is used. The source interior is isolated from the external environment, 106, by high vacuum seals between these components, or is mounted internally inside the process vacuum chamber. A controlled flow rate of process gas is introduced to the ion source from gas inlet 107 or through a gas distribution ring. A reduced pressure (typically 0.1–0.5 mTorr) is maintained in the interior region, 108, by means of a high vacuum pump situated in the process chamber (not shown).

A plasma is generated in 108 in a conventional manner by application of rf power (typically on the order of about kilowatt, in a frequency range of about 0.5–15 MHz) from electrical power supply and matching network 109 to an externally mounted rf coil antenna, 110, which is disposed about the dielectric "window" 102. The rf electrical current circulating in the coil generates an axial magnetic field which is transmitted to the plasma through the "window." This rf magnetic field induces an azimuthal rf electric field inside this plasma region concentric to the rf coil. The induced electrical field accelerates electrons inside the plasma discharge chamber to travel along parallel circular paths. Collisions with neutral gas atoms, introduced to the plasma source through the gas inlet 107, result in ionization of said atoms and generation of additional electrons that are in turn accelerated in the electrical field. In such manner, this type of plasma generator can generate relatively high plasma densities, on the order of $10^{11}$ cm$^{-3}$. To provide the initial "seed" electrons required to ignite the rf ICP source, the plasma may be ignited by imbibing electrons generated by an electron source in the process chamber (not shown) during the start-up period. Alternatively, an igniter may be provided within the plasma generator. This igniter may be a pair of electrodes attached to a spark generator.

The rf coil may be a typically helical or, preferably, a straight cylindrical design (the axis of each turn of the coil being coincident to the axis of the plasma discharge vessel, connected by bending straight "legs" in the coil). A straight cylindrical rf is preferred to the helical coil shape due to its greater cylindrical symmetry, which can help the symmetry of the plasma, and the fact that it is easier to control such a coil in terms of the spacing between the turns and between individual turns and the boundary of the plasma discharge (which affects the rf capacitive and inductive coupling).

In this embodiment, the position of the "re-entrant vessel" 103 is adjustable, as shown by arrow 113. The height of the plug, H, is defined as the closest distance between the facing surfaces of the re-entrant vessel 103a and the grid assembly 105. A seal 111, such as a simple O-ring, is formed between the re-entrant vessel 103 and the back plate 104 to hold the inner cylinder and prevent transport of gases or other materials between the interior 108 and exterior 106. Various shape adjusting extensions 112 such as 112a and 112b, shown schematically in the figure, may be attached to the re-entrant vessel. The vessel itself may be asymmetrically shaped or disposed within the plasma.

The grid 105a in the ion optics assembly 105 that is contacting the plasma, known in the literature as the "screen grid" is shown as being modified by the local adjustment of the grid thickness, e.g. by the addition of local ion beam extraction tuning features, represented schematically by items 175 and 176 or by reduction of the local thickness (by machining away a portion of the grid plate 105*a*) as shown in feature 177. Item 175, described herein as an ion acceleration length tuner, is disposed continuously around the aperture(s) of interest and effectively locally increases the thickness of the screen grid. Item 176, described herein as an aperture size tuner, is disposed continuously around the aperture(s) of interest and essentially locally decreases the aperture size and increases the thickness of the screen grid. Item 177, described herein as an ion acceleration length tuner, is disposed continuously around the aperture(s) of interest and effectively locally decreases the thickness of the screen grid. The thickness of the features 175 and 176 can be adjusted to provide the desired effect. These features can be machined into the screen grid or can be added to a pre-machined grid plate. If the grid plate is not pre-machined with this feature, it can be afterward machined to produce feature type 177. Features types 175 and 176 can be added after the fact, by spot welding tantalum foil to a molybdenum grid plate, which is very useful for prototype development of a grid design according to this method.

Figure 11:
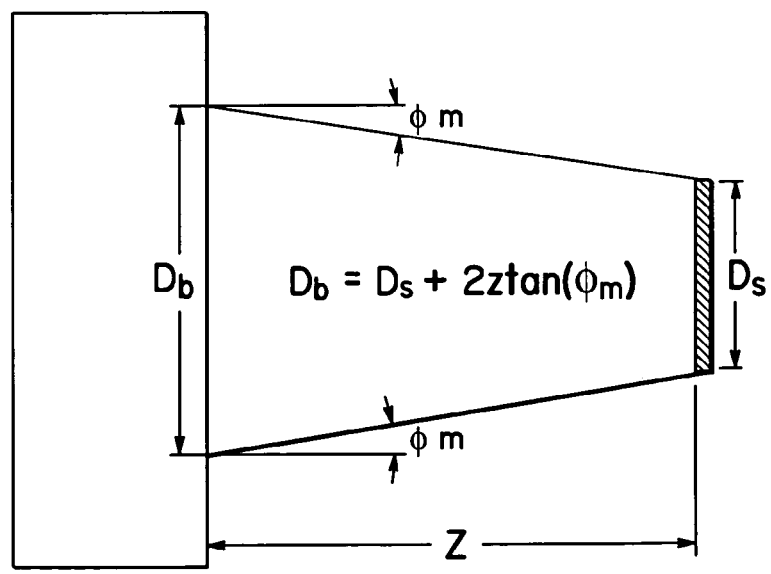
FIG. 11 is an illustration of the calculations used to determine the grid pattern diameter for a given substrate size.

The ion optics is preferably designed for very low beam divergence while still allowing sufficient beam current to be extracted, as is known in the art, by adjusting the grid hole sizes and grid spacings. The size of the array of holes forming the grid pattern is selected to be sufficiently large that it does not negatively affect the substrate process uniformity due to the "edge effects" of the hole pattern, but otherwise is minimized to reduce the power required to drive the ion source at a certain desired beam current density, and also to maximize the mechanical stability of the grid assembly. This size can be determined theoretically or empirically. A simple theoretical method for estimating this size would first determine the border of the substrate processing region of interest and then project this border back to the grid plane based on the most divergent significant ion trajectories. To estimate the impact of a particular border region on a given point on the substrate path, the number of holes which create the disturbance can be compared to the total number of holes within the "cone of influence" that contribute to the ion beam treatment process at that same point on the substrate. If the substrate is rotated (except for circular substrate), or otherwise moved during the ion beam process, this border will be larger than for a static substrate, but the impact will be reduced due to the averaging effects of the motion. Also, the further the substrate is located from the ion optics, the larger the required diameter of the grid pattern will be. A fully quantitative calculation would require a mathematical model of the entire array of beamlets, however, a very reasonable estimate can be obtained based on assuming a maximum straight line beam divergence angle for all of the beamlets, which can be derived from experimental measurement, or modeling of a single beamlet based on the ion optic design, or from calculations for the same ion optic design published in the literature. An example of this calculation is shown in FIG. 11. For the examples described below, a 12" diameter grid pattern was used.

To control the spacing of the grid plates a high voltage dielectric material such as alumina is disposed between the plates at the periphery of the assembly. Preferably, to further improve the mechanical stability of large area ion beams, additional dielectric spacers are used in the beam extraction area. However, use of such spacers creates islands of missing grid holes which locally disturbs the local uniformity and angular distribution the extracted ion beam and can impact the substrate treatment process. While such disturbances are practically insignificant in Prior Art ion source designs, it has been found by the inventors to be significant for the high beam collimation conditions and extremely stringent uniformity specifications of the present invention.

Furthermore, it is more significant for a static substrate treatment process, wherein rotation of the substrate cannot be used to average out exposure of the substrate to local effects of the ion beam. To resolve this problem, the present invention utilizes the following design: a few spacers are used in the beam within a region between the edge of the beam pattern and a restricted area within which such spacers can significantly impact on the beam profile at the substrate. The restricted zone is determined from theoretical calculation or empirical data, in an analogous manner to that of the calculation of the minimum grid pattern diameter, described above (see FIG. 11), however, in this case the impact in any one local region is of only individual islands, rather than a complete border of missing holes, therefore, a few spacers can be tolerated even relatively close to the substrate center, if said spacers do not require large islands of missing holes. For optimum mechanical stability of the grid set, it is preferable if the spacer locations have some degree of symmetry, although the impact on a rotating substrate can be greater in that case. It is also clear for this design that any other type of disturbance of the grid pattern, other than those as described herein to improve the substrate process, must be kept outside of this restricted zone. This is a reason that the "micromasking" or "acceleration-length-tuning" methods were developed as part of this invention for controlling the local beamlet currents instead of blocking out individual apertures or arrays of apertures, as is done by cruder Prior Art grid patterning and masking techniques.

For the Low Divergence grid set described in the examples below, six spacers were located on 60 degree sectors on a 7.5" diameter. In the case of very large grid spans, it may not be preferable to completely restrict spacers from the impact zone without sacrificing the grid mechanical stability. An alternate design in this case is the same as described above, except that one single spacer in the center of the beam is allowed. The impact of this center spacer on the substrate treatment in the case of rotating substrates can be minimized by introducing an offset between the axis of the grid spacer and the axis of rotation of the substrate.

One further aspect of the embodiment is the addition of an array of localized rf magnetic flux concentrator(s) 185 in some portion of the rf coil. One such representative piece is shown schematically in the figure.

Figure 2:
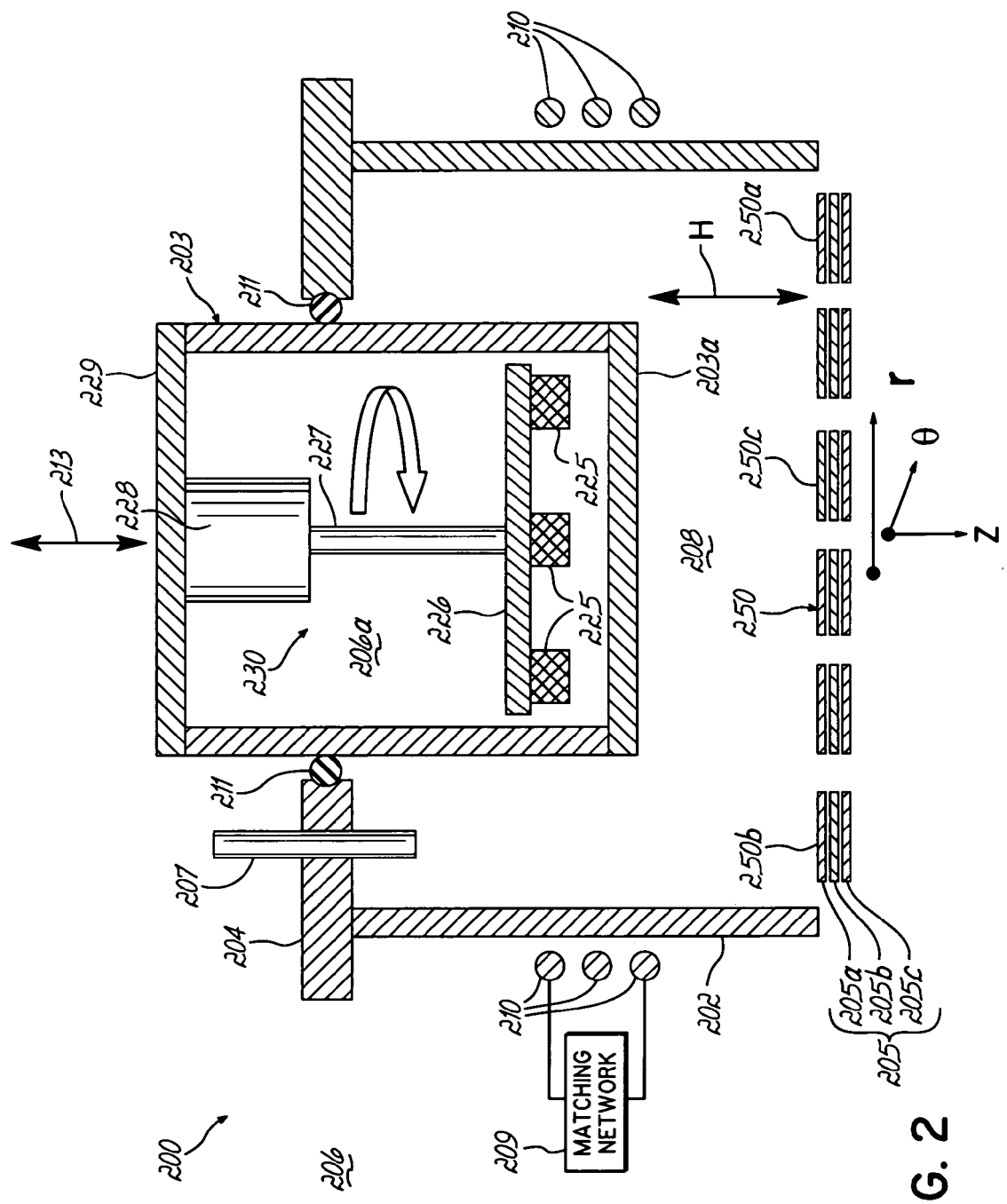
FIG. 2 is a cross-sectional view of a cylindrical chamber in accordance with a second embodiment in accord with principles of the present invention.

Another embodiment is shown in FIG. 2. In that embodiment, the height of the magnet array may be adjusted independently of the height of the RV, e.g. by adjusting the length of the shaft 227.

Figure 2B:
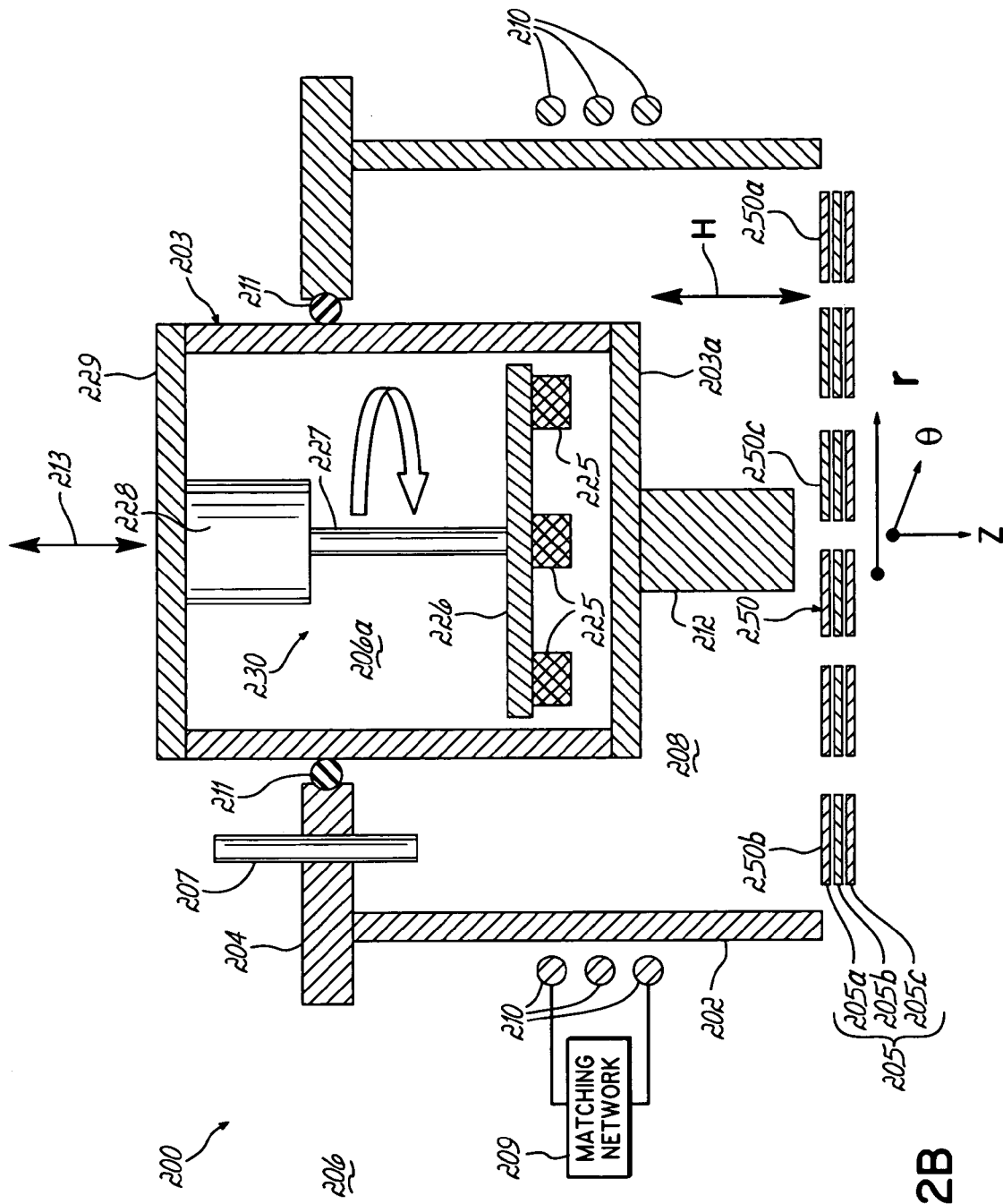
FIG. 2B is a cross-sectional view of a cylindrical chamber in accordance with a third embodiment in accord with principles of the present invention.

Another specific embodiment is shown in FIG. 2*b*, in which the RV has a smaller cylindrical extension 212.

Returning to FIG. 1, to achieve high plasma and ion flux uniformity the overall shape of the plasma discharge chamber has been optimized. The position of a shaped re-entrant inner vessel 103, the shape of the extensions 112, the rf flux concentrator 185 and the beamlet extraction tuning features 175 and 176, allow further adjustment of the uniformity of plasma density and the ion flux that reaches the array of ion optical elements that make up the grid assembly 105 by interfering with the ion diffusion process.

Without such features, a co-axial coil ion source designs is generally characterized as follows. A rapid decrease in the rf electric field from the rf coil with penetration distance into the conductive plasma (the skin effect) results in the electron temperature Te of the plasma and the ionization rate being higher at the periphery of the plasma volume near the rf coil. However, ionization processes can occur even far from the rf coil, due to the collisionless nature of the plasma at typical pressures. Furthermore, generated ions, if unimpeded, will diffuse in different directions and will recombine at the walls. Calculation of the plasma and electron temperature distributions is difficult due to the difficulty of accurately modeling a low-pressure collisionless plasma. The usual first order effect is a decrease in plasma density n with radius "r" from the center. Thus the plasma density at the plasma sheath formed at the surface of the ion optic assembly is greater at the center region 150$c$, than the peripheral regions such as 150$a$ and 150$b$.

The ion flux reaching the ion optic surface, being directly proportional to n and $Te^{1/2}$, may be more uniform, given the average Te is expected to be higher on the periphery, which can at least partially compensate for lower n in determining the uniformity of the ion flux. This factor can result in the peak of the ion flux profile being located in a position other than the center of the plasma discharge chamber, even if the discharge chamber design is itself symmetrical (depending on the gas species, discharge chamber geometry, pressure, etc). In other words, on average, the flux uniformity may not change monotonically with source radius. Another consideration is that, again due to the Te dependence of $\phi$, optimization of the uniformity of both n and $\phi$ may not be possible and ideal means of plasma adjustment should optimize both or at least allow independent optimization. Another important consideration is that even if the discharge chamber itself is perfectly symmetrical, relatively recent work has shown that several factors, including rf transmission line effects and ponderomotive forces, will result in plasma asymmetry. The result is that there will be several "spots" of high or low plasma density and electron temperature superimposed over a more "global" pattern of radial variation in the plasma density. These variations result in greater beam uniformity variation than is desired according to the primary objective of this invention.

It has been found that to improve uniformity, the beam divergence angle uniformity and parallelism must be improved. The approach used in the present invention to develop a design which minimizes these nonuniformities is as follows:

1. The number and shape of the rf magnetic flux concentrator pieces 185 is determined by measuring the uniformity of the rf magnetic field of the bare rf coil and adding flux concentrator pieces to raise this magnetic field where required. One option is a complete 360° flux concentrator, which would minimize any variations in the rf coil from affecting the uniformity of the induced magnetic field in the plasma.

2. Optimum ion beam parameters are chosen, based on the ion optic design. The optimization procedure depends on the particular objective. For the primary objective of this invention, a typical range of process pressure (about $2\times10^{-4}$ Torr) is selected. A range of ion beam voltages is selected to achieve the desired substrate etch rates, and the beam current and other grid potentials are then optimized to provide desired conditions of minimum beam divergence. The plasma uniformity is characterized at the selected pressure and rf power conditions.

3. The variation in plasma density and electron temperature at the grid plane is measured at the beginning and after major adjustments using miniature Langmuir probes inserted in various apertures of the grid set; the saturation ion current (ion flux) reaching the grid is also measured. In latter stages of investigation, the source design is more finely optimized based on actual beam current uniformity and beam dispersion (divergence, divergence uniformity, parallelism) measurements. A beam uniformity fixture having a large array of measurement points across the beam diameter is used to provide the higher accuracy and resolution of the beam profile required to meet these objectives. Actual beam treatment (etch) data is also periodically measured during the source development process and fed back to the source design. This is a very effective and almost necessary means of optimizing to attain the extreme levels process uniformity required, and is particularly important for determining the uniformity of a static, tilted etch process.

4. Based on data obtained on a prototype discharge chamber, the diameter $D_p$ of the plasma discharge chamber with respect to the size of the grid pattern $D_g$ is optimized. In the present design, a ratio of $D_p/D_g=1.3$ to 1.8 has been found to be a reasonable range wherein the electron temperature and the plasma density are quite uniform; such large ratios are not used in prior art designs due to the otherwise high geometrical inefficiency (excess size and cost considerations).

5. The initial re-entrant vessel 103 diameter is nominally designed as a cylinder and mounted with its axis co-incident with the axis of the discharge chamber 102. Its diameter is chosen based on several factors, including the diameter of the substrate to be processed by the ion beam, the diameter of the grid pattern, the rf skin depth, accommodation of certain embodiments of the invention, etc. The height range is designed to come within a close distance of the grid assembly at minimum H, and to be as large as L, the length of the discharge chamber 102 at maximum. In general, the plasma density/ion flux at the center is suppressed by decreasing H, or enhanced by increasing H. It has been found that this is more effective for changing the beam profile at large radii (such as r>4" for the current design). For smaller radii, there is still some effect, but other adjustment factors can be more effective.

6. One or more extensions 112 to the re-entrant vessel are used to fine-tune the radial variation in plasma and ion flux distribution, and to flatten out asymmetric peaks in the plasma distribution. The location and size of the extension is determined by the size of the feature to be adjusted. The height of the extension is optimized. The same general rule is applied for adjusting the height of the extension as described above for adjusting H, the height of the re-entrant vessel itself. However it has been found that at a certain close range of distance from the screen grid, the effect of such extensions becomes complicated. Instead of a decrease in the beam current density under the extension, large dips are seen around the edges of the feature. Operation in this range is not useful.

7. Residual peaks in the plasma density profile are reduced using the ion acceleration tuning features 175 and/or 176. These features are confined to one or more apertures of the ion optics assembly in the relevant region of interest and serve to adjust (reduce) the ion beam current extracted from the plasma at a local site on the ion optics, to compensate for residual variations in the plasma density. They work in part by taking advantage of the fact the ion beam current is inversely proportional to the gap "g" between screen grid 105$a$ and the accelerator grid 105$b$, and thus inversely proportional to the thickness "t" of the screen grid (a more exact relationship is that the maximum current that can be extracted is inversely proportional to the square of the effective ion acceleration length, d, which is commonly defined as the distance from the center of the plasma meniscus at the screen grid 105a to the facing surface of the accelerator grid 105b. The required adjustments are calculated based on previously developed empirical correlation charts and, if necessary, further tuned. Feature type 176, in which the hole size as well as the thickness is adjusted, is used where the effect required is relatively large. The adjustment is calculated based on the beamlet current density being directly proportional to the area of the aperture. Feature type 175 is used for fine tuning. In using these adjustments care is taken (if required by the particular objective) not to disturb the beam divergence at the expense of improving the flux uniformity, or vice versa.

8. Finally, process parameters, including pressure and gas flowrate, are optimized.

For some of these factors, in particular optimizing the size of the discharge chamber, both plasma density n and ion flux $\phi$ can be optimized simultaneously. Other factors influence n or $\phi$ to relatively different degrees. The combination of several adjustment techniques, as described, allows better overall optimization.

As an alternative to the requirements for a perfectly uniform plasma distribution, a particular nonuniform plasma or ion flux profile may be attained, for example to compensate a systematic variation in the beam profile due to a systematic non-uniformity of a particular grid assembly or to improve one feature (such as the ion beam process uniformity) in particular. In yet another alternative, the starting ion optic pattern may be made deliberately non-uniform to improve the global uniformity of the beam current density prior to adjusting the plasma generator. This may be a preferred approach for certain features that are relatively hard to adjust in the plasma. For example, to flatten the plasma density profile in the center region of the discharge chamber. Also, the optimum grid design can improve efficacy of the incorporated plasma adjustment features. For example, most of the adjustment techniques described above work by suppressing the extracted beam current from a certain region rather than enhancing it. If the stable plasma profile has a large dip in the beam current density (ion flux) map, the best method of improving it may be to open the grid pattern in that area only, leaving the local "high" spots to be treated by one of the aforementioned adjustment methods Other aspects of the grid design are based on the requirements for beam divergence and reduced sensitivity to variations in the mechanical structure, as are known in the art.

In another aspect of the invention, a magnet, either permanent magnet or electromagnet, is placed inside the re-entrant vessel described above, positioned at an optimum height H. These embodiments are discussed in further detail below with reference to FIGS. 2, 2b and 12–15.

Materials of construction are as follows. 102 is dielectric, at least in the "window" area adjacent to the rf coil. Usual materials are quartz or alumina. Items 103, 104, 112 are typically also dielectric, to minimize rf coupling to them from the coil. Depending on the design, however, they may be fabricated from a nonmagnetic conductor material compatible with the gas plasmas employed in the discharge chamber, e.g. Aluminum, anodized Aluminum, or Copper. If a conductor is used for 104 proper care should be taken to isolate the exterior from human exposure to the high potentials generated by the ion source. Grids used in assembly 105 are preferably molybendum, carbon, or other materials which have good mechanical properties and electrical and thermal conductivity at operating temperatures (roughly about 100–500 C) and are resistant to warpage under thermal cycling between operating and room temperature. Sliding seal 111 may be any vacuum compatible compliant material, such as Viton. RF magnetic flux concentrator 185 should be made from a high frequency magnetodielectric material, such as ferrite or suitable materials known under the commercial name Fluxtrol.

FIG. 2 illustrates an alternative embodiment in which like numbers are used to reference like parts to those of FIG. 1, incremented by 100. Referring now to FIG. 2, in one embodiment of the invention, mounted inside the re-entrant vessel 203 is a internal magnet assembly 230 consisting of an array of magnets 225 attached to a plate 226, which is in turn attached to a rod 227, and said rod is attached to a motor 228, which is mounted on a lid, 229. With this assembly, the magnet array 225 may be rotated during the ion beam process.

It has been found with this construction that both fixed magnet and moving magnet arrays 225 can be very beneficially used to improve the ion beam processing uniformity. In general, their influence can be predicted from the fact that magnetic fields disturb plasma diffusion by reducing the conductivity of electrons in directions perpendicular to the field lines and increasing their density along the field lines. The location of the magnets inside the adjustable height re-entrant vessel allows optimum positioning of these magnetic field lines with respect to the rf coil and the ion optics. Different magnet arrays may be used.

FIG. 2b illustrates a further alternative to FIG. 1, in which like numbers are used to reference like parts, incremented by 100. This embodiment features a cylindrical extension 212 on the RV.

Figure 3C:
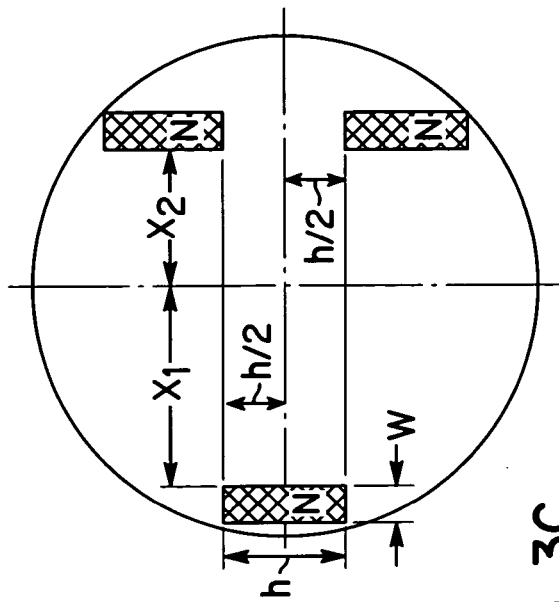
FIGS. 3A, 3B and 3C are schematic views of alternative magnet arrays that may be used with the chambers of the preceding Figs.
Figure 3B:
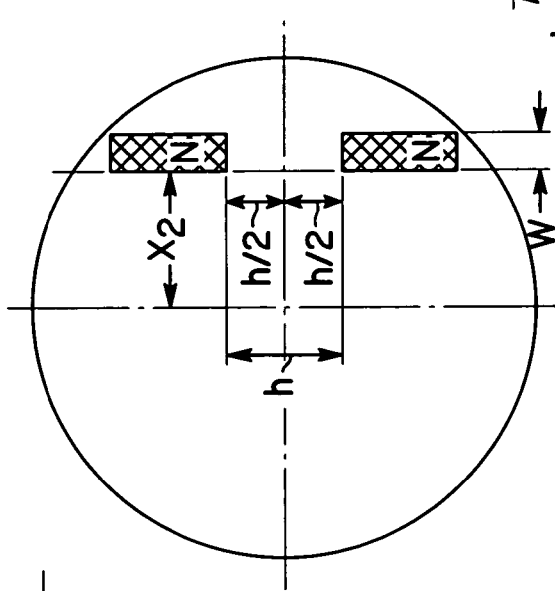
Figure 3A:
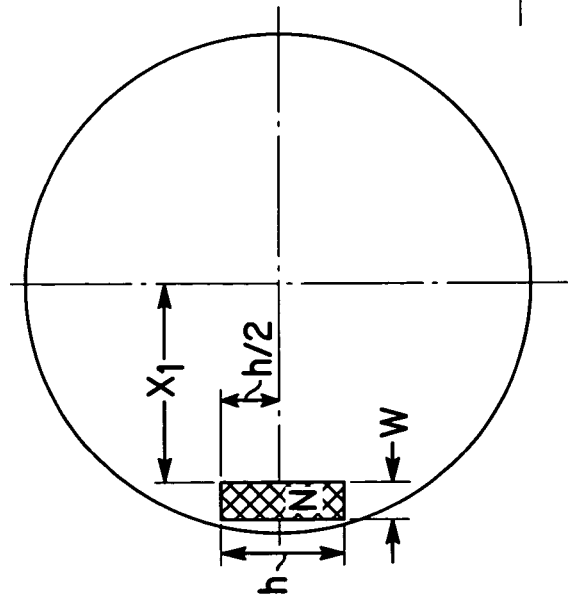

Some examples are described in FIG. 3. FIG. 3 is a diagram showing 3 different prototype magnet configurations that were tested with the Rotating Magnet Array (RMA) as viewed from the bottom (facing the plasma). Each magnet is of the same dimensions as the first, they have a square cross-section of dimension "w" and their length is "h." The positions of the magnet are indicated from the center of rotation. The magnets are pictured inscribed on a circle approximately representing the outer diameter of the RV.

More specifically, the following magnets were used: SmCo h=1.77", w=0.591", approximate magnetic field strength at magnet face=3.5 kGauss.

More specifically, $x_1$=3.25", $x_2$=2.25".

For these specific examples the following data describes the effect of each of these magnet arrays on the etch uniformity (calculated as 3sigma/mean) of an unpatterned static 6" diameter wafer held at 9" from the ion beam:

| Configuration | Without Magnet Rotation | With Rotation |
| --- | --- | --- |
| No magnets | 4.3% | |
| 1-magnet | 27.3% | 9.6% |
| 2-magnet | 16.8% | 3.1% |
| 3-magnet | 9.6% | 2.4% |

With rotation of the magnet array, both the 2-magnet and 3-magnet arrays provided better uniformity than the configuration without magnets.

For these prototype tests, the magnet array was suspended in the plasma immediately below the Re-entrant Vessel (RV), through a hole in the RV. However, for convenience, and since prolonged direct exposure to the plasma can overheat the magnets, in a Production system the magnets should be moved inside the RV.

The process for selecting the permanent magnets to be used is as follows:

1) Start with a given size magnet;
2) Place magnets in region where plasma density (or ion beam current density, if monitoring the ion beam directly) should be enhanced;
3) Adjust magnet parameters to optimize results: the arrangement of the magnets, the number of magnets in the same region, or the size or magnetic field strength of the individual magnets. Also the polar orientation of the magnets can be optimized. In general, the current will be enhanced in the local area of the magnet.

Preferably, high strength SmCo permanent magnets are used, but other standard magnet types, such as AlNiCo, may also be employed. The North-South polar orientation of the magnets can be varied and optimized. Typical "cusp" magnetic arrangements may be used. Pole pieces of soft magnetic material may be used to localize magnetic fields to areas of particular concern. In optimizing the magnetic field strength and configuration, it is important to minimize any deleterious effects of the magnetic field penetration outside of the ion source. Such effects may be to disturb the ion beam neutralization or the effective plasma meniscus (beam divergence uniformity, beam parallelism), the rf match, or the extracted beam current. It may be beneficial to reduce such magnetic field penetration using standard magnetic shielding material, or special bucking coils. Different types of magnet arrays may be considered.

The rotating magnet array 230 was invented specifically to improve the ion beam etch uniformity of a statically held substrate located in the ion beam process chamber, not shown in FIG. 1. After optimization of other factors involved in static etching (reducing beam dispersion and purely radial variations in beam current density), the static etch uniformity is limited by local variations in the current density flux, related to plasma asymmetry. Fixed magnets introduce their own asymmetric magnetic fields, and thus are difficult to optimize for a static substrate treatment process. The concept of magnet rotation is to "average out" the asymmetric effects obtained with the magnets by "rotating the plasma" during the ion beam process as an alternative to the forbidden act of rotating the substrate. With an optimized choice of magnets in the magnet array this worked very well, resulting in a much more uniform and symmetric etch pattern in an ion beam etch processes. Later, the operative mechanism was exactly confirmed: by looking through the transparent quartz discharge chamber the apparent rotation of bright spots in the plasma in phase with the magnet rotation was seen (and recorded). For the rotating magnet array, the three magnet configuration described in FIG. 3 was found to be preferable for improving beam current uniformity for both rotating and static etch processes on a 6" diameter wafer.

Conversely, etch uniformity on a rotating substrate in the path of the ion beam (substrate located in the process chamber (not shown)) was optimized with the same magnet array held in a fixed position. This is a case where the ion flux profile in the plasma and the beam current density profile were deliberately allowed to be somewhat non-uniform to achieve higher process treatment (etch) uniformity. The preferable magnet configuration produced a nearly linearly varying beam current density from one edge of the substrate, to the other. When the substrate was rotated, the resultant uniformity was improved over other configurations. The orientation of the magnet array 225 was optimized by indexing it with respect to the discharge chamber 202 using the motor 228 and rotating fixture parts 226–228. These adjustments resulted in substrate etch uniformities much better than were achieved by optimizing the position of the re-entrant vessel 103 alone. The rotation rate of the array should be set to allow at least 3 and preferably more than 20 rotations of the assembly for the minimum process time when continuous rotation is desired, to allow for sufficient averaging.

In an alternative embodiment of the same concept, the magnet array may be indexed to certain positions during the process using, for example, a stepping motor. This can produce partial averaging effect, while deliberately emphasizing certain positions.

Figure 4A:
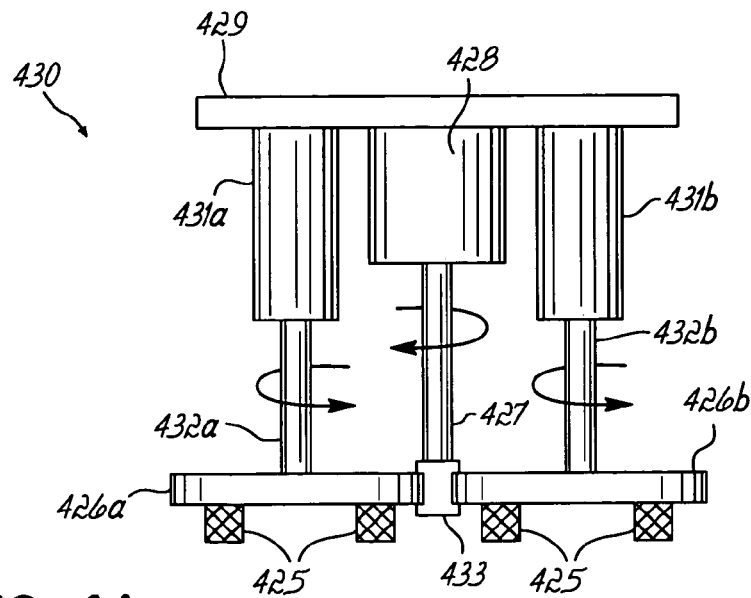
FIG. 4 are bottom and side views of a planetary magnet array usable with the chambers of the preceding Figs.
Figure 4B:
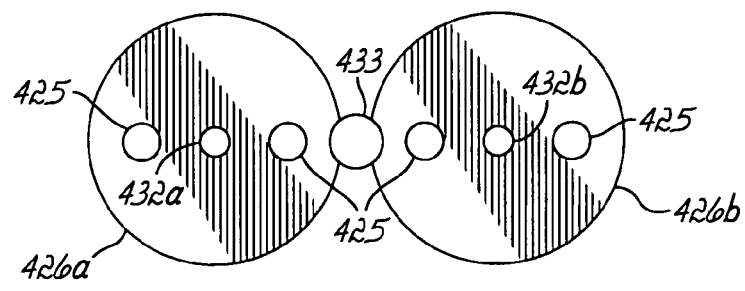

In yet other embodiments of a magnetically enhanced source, other means of improving the uniformity of a plasma using moving magnets can be used. An assembly of two or more magnet arrays can be placed inside the re-entrant vessel and rotated on different axes, to simulate "planetary motion." One such magnet assembly 430 suspended from lid 429 is illustrated in FIG. 4. Although only two planets are shown for convenience, preferable three or more planets 426a, 426b are used to improve the control and symmetry of the process. Although only two magnets 425 are shown on each planet, preferably more magnets are used on each planet to improve control of the process. Although the magnets are labeled in the Figure to be equivalent, different magnet strengths can be used on each magnet to improve control. The polar orientation of the magnets is not shown, but may be adjusted to improve the process. The magnet array may be driven via shaft 427 and pinion 433 by a single motor 428 for convenience, as shown in shadow, or each planet can be independently controlled with its own motor 431a and 431b via shafts 432a and 432b.

Figure 5A:
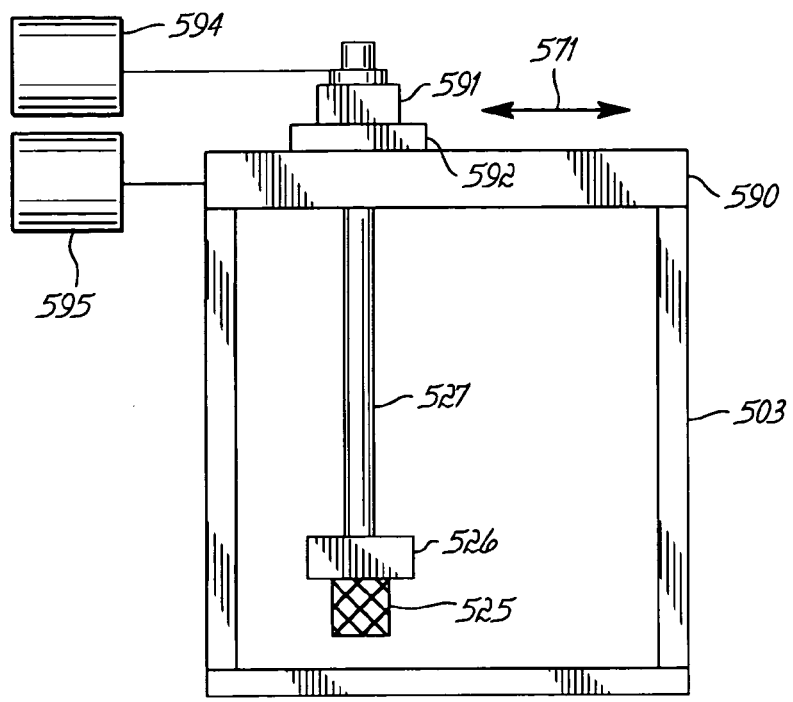
FIG. 5A is a side view of an XY magnet arrangement usable with the chambers of the preceding Figs.
Figure 5B:
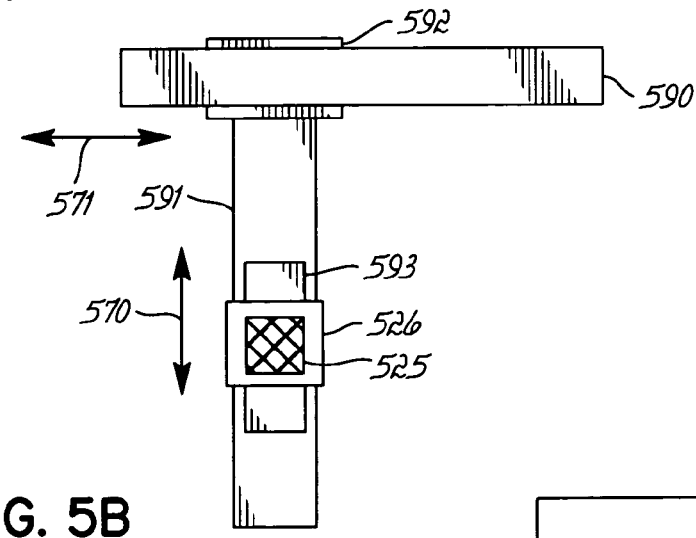
FIG. 5B is a bottom view of an XY magnet arrangement usable with the chambers of the preceding Figs.
Figure 5C:
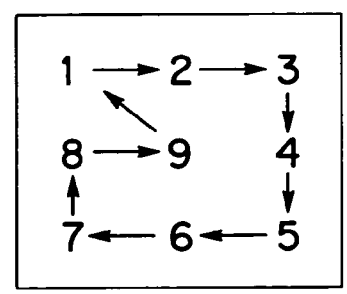
FIG. 5C is a motion cycle diagram of an XY magnet arrangement usable with the chambers of the preceding Figs.

Alternatively one or more magnets may be moved linearly inside the re-entrant vessel using an X-Y stage, as shown schematically in FIG. 5. There, magnet 525 is moved to two dimensions linearly by motors 594 and 595, as indicated at 570 and 571. Supports 590 and 592 enable a first dimension of movement as do supports 591 and 593. The dwell time of the magnet in any one location can be optimized. The symmetry of this type of process is more suited to improving the beam treatment uniformity of rotated substrates.

In all of the moving magnet concepts where the objective is good beam treatment uniformity, the magnet should preferably achieve at least 3 to preferably at least 20 cycles of motion during the process.

The method of optimizing the ion source using these magnetic enhancement methods is similar to that described for the optimizing the embodiment of FIG. 1. In addition, the magnetic field distributions are mapped at certain points in the development to facilitate the design. All of the embodiments described in FIG. 1 and FIG. 2 may be combined.

The detailed design of all of embodiments described above can be permanently fixed after being optimized. Some features may easily be left adjustable in order to accommodate different requirements or to compensate for variations between modules. This includes the height H of the re-entrant vessel 103, the number and shape of the magnetic flux concentrator tuning elements 185, the number and dimensions of the extensions 112, the number and dimensions of the grid tuning features 175–177, the number, field strength, dimensions, and patterns of any magnets (e.g. 225, 425), etc. A few features may be controlled in-situ, using some type of in-situ diagnostic monitor, such as etch or beam uniformity to indicate a deviation from acceptable condition, and then a controller to change the tuning feature to adjust for it. This can be done for example if electromagnets instead of permanent magnets are used for magnetic control of the plasma uniformity. In that case, the magnetic field can be tuned by adjusting the current to the electromagnet. In the case of the rotatable magnet assembly 230, the azimuthal orientation of the magnet array can be adjusted by controlling the current to the motor, programming a deliberately non-uniform rotation profile, or sweeping the magnet array over less than a full rotation. Similar tuning algorithms can be developed for the other magnet motion concepts. Sophisticated algorithms for in-situ control can be developed according to the method of optimization of these features described above. In general, the figure of merit being monitored by the diagnostic feature can be recorded as the tuning feature is adjusted through a predetermined range, and then the optimum feature setting can be set based on the results.

Figure 6:
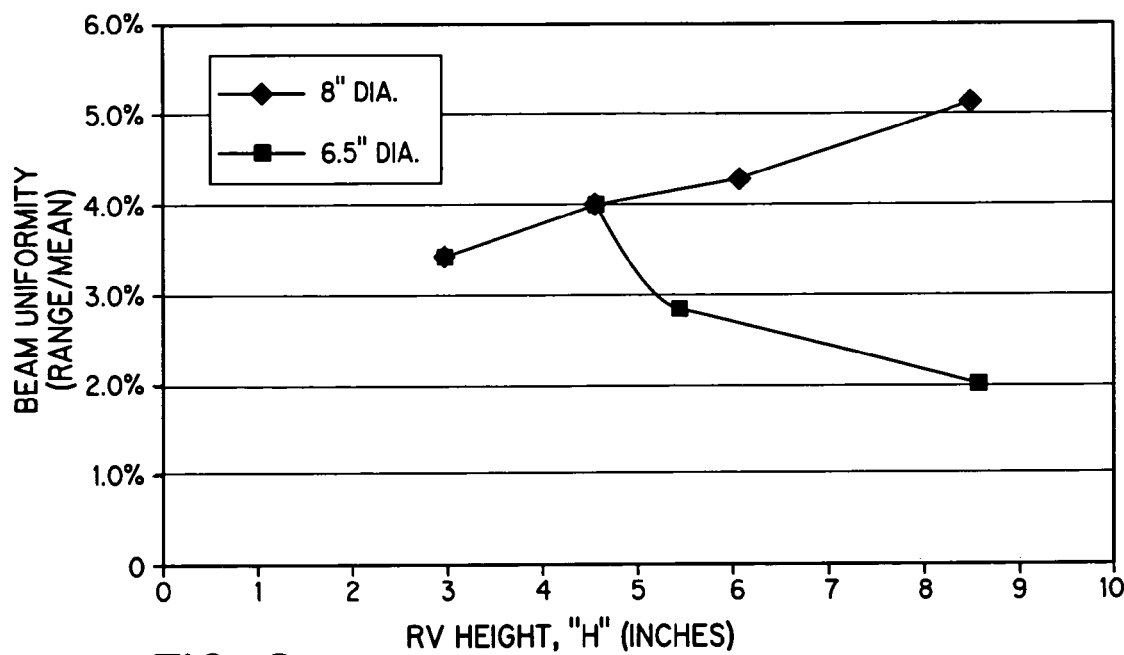
FIG. 6 is an illustration of the effect of the position of the re-entrant vessel on beam uniformity for various configurations.

FIG. 6 shows a plot of Argon ion beam uniformity for two different measurement diameters vs. RV height, "H." Beam uniformity was measured using unbiased Faraday cups without an auxiliary neutralizer. For this data, measurements were made across a linear section of the beam, with an array of 14 Faraday cups spaced 0.73" apart.

The data shows that the effect of the RV depends strongly on the measurement diameter of interest. It is clearly shown that the plasma and beam uniformity over certain measurement diameters greater than the RV diameter can be improved. For measurement diameters much smaller than the RV diameter, insertion of the RV into the ion source (up to the distance tested) appears to have either a negative or minimal effect on plasma and ion beam current density uniformity.

However, it has been further found by the present inventors that with the use of asymmetrical extenders attached to the RV (together with grid Micromasks (hole diameter and acceleration-length tuners)) or particular magnet arrays inserted inside the RV, the source configuration with RV can provide improved beam uniformity over such diameters.

Figure 7:
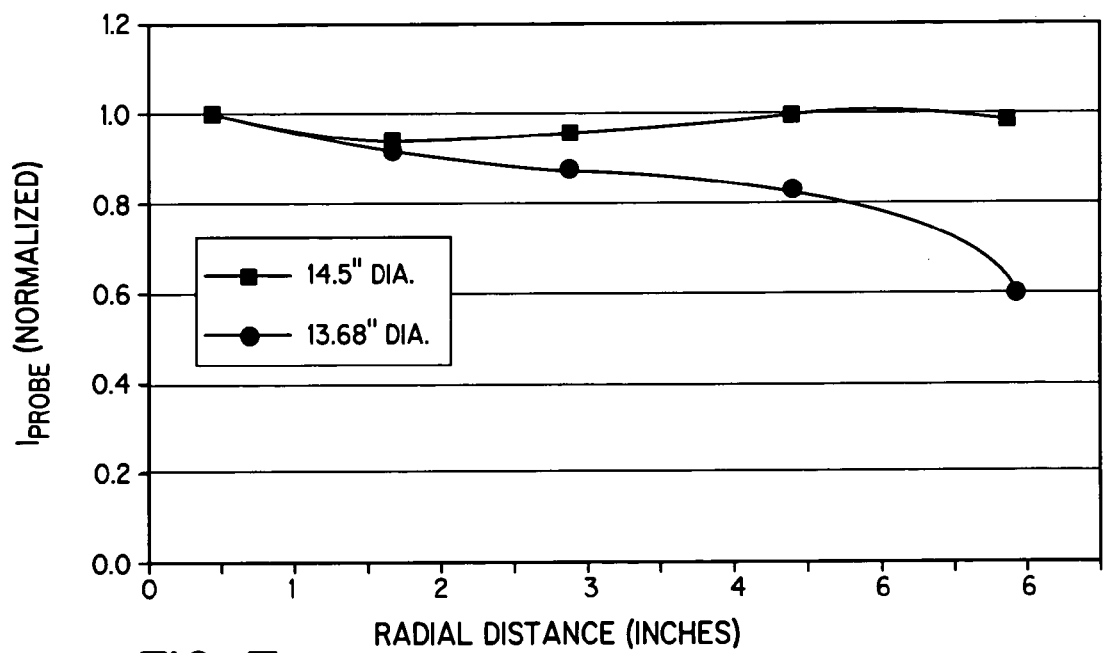
FIG. 7 is an illustration of the effect of a larger plasma and re-entrant vessel on the ion current density profile.

FIG. 7 shows a comparison between a state-of-the-art Prior Art 13.68 inch diameter chamber ion source design and a similar 14.5 inch diameter chamber design with an 8.25 inch diameter RV inserted to H=3.62 inches from the ion optic surface on the radial profile of the Argon ion current density at the plasma sheath of the ion optics. The RF power is 1000 W.

Figure 10A:
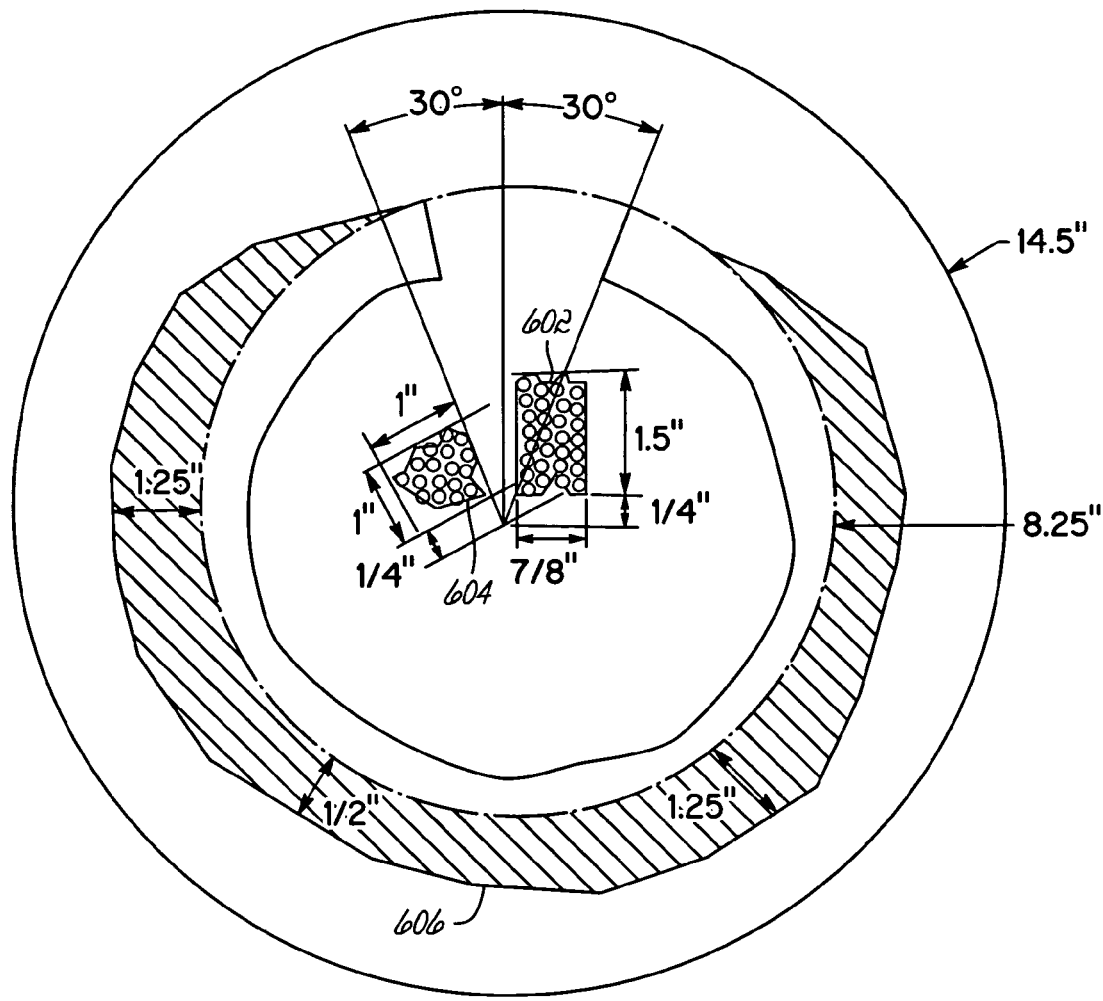
FIG. 10A is a bottom view of an exemplary embodiment using a re-entrant vessel extender and masks on the ion optics grid.
Figure 10B:
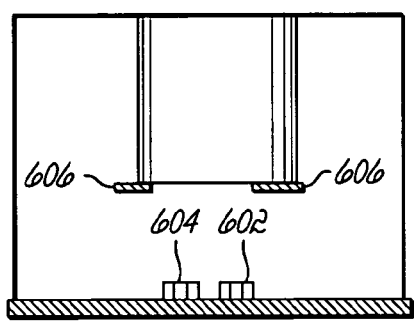
FIG. 10B is a side view of an exemplary embodiment using a re-entrant vessel extender and masks on the ion optics grid.
Figure 12:
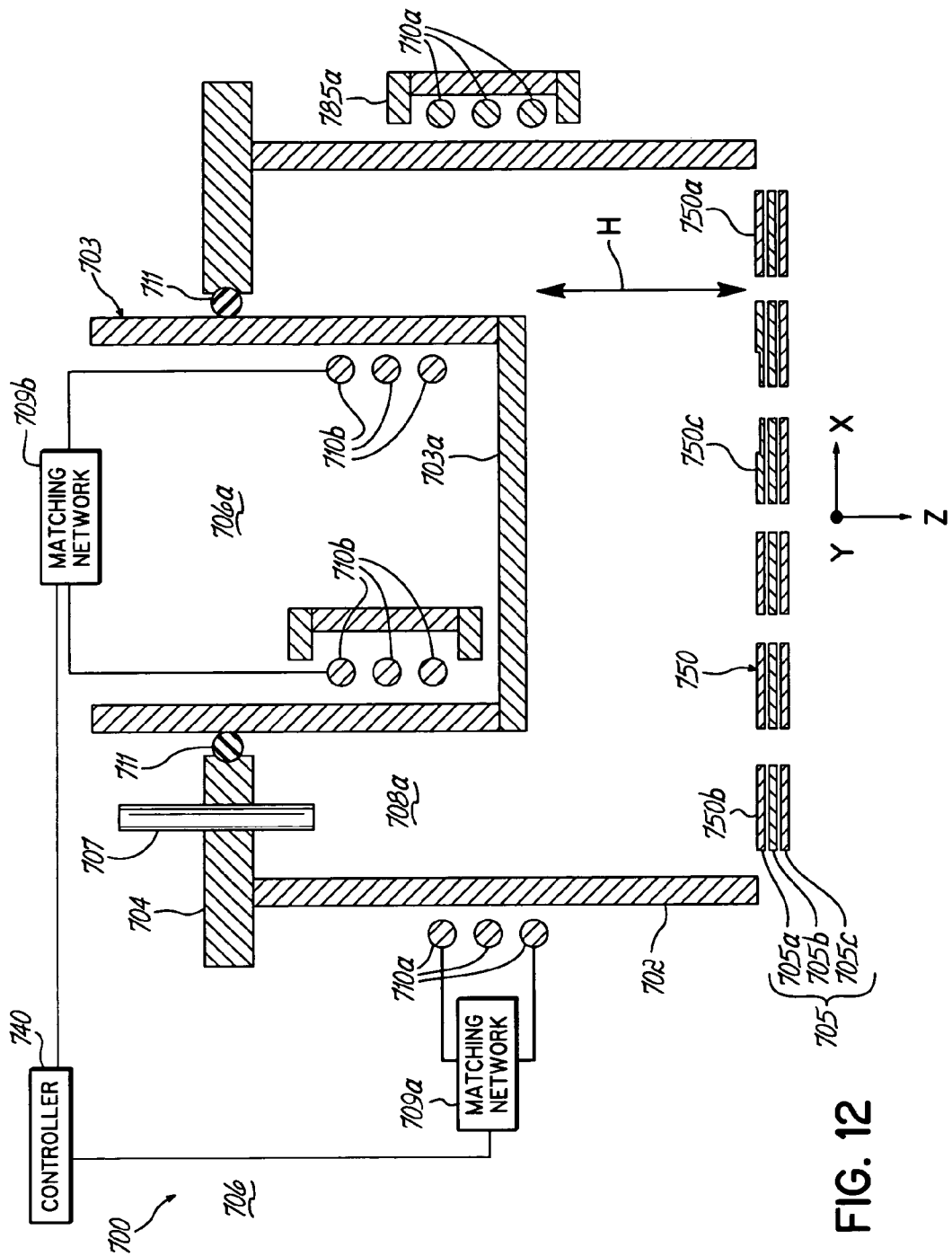
FIG. 12 is a cross-sectional view of an alternative embodiment of a chamber in which the re-entrant vessel includes a second radio frequency coil and magnetic field shaping structures.

FIG. 8 compares the Argon ion beam un-patterned etch uniformity over a 6 inch diameter substrate of two different state-of-the-art Prior Art ion source designs and two different embodiments of the invention. Details of the first embodiment, 14.5 inch plasma source with Low Divergence Grid Assembly RV Extender, and Micromasks, are illustrated in FIG. 10. The height of the RV (H) was 4.25 inch. For the second embodiment, 14.5 inch plasma source with Low Divergence Grid Assembly and Rotating Magnet Array, the magnet array of FIG. 3*c* was used. The distance from the face of the magnet array to the plasma side of the screen grid was 4.25 inch. Both embodiments use the 8.25 inch cylindrical RV.

FIG. 9 compares the beam dispersion properties for the same configurations at the same beam parameters. Divergence angle is defined in this table as Maximum etch angle measured with an etch divergence fixture.

It is shown by this data that both embodiments of the invention provide improved unpatterned etch uniformity and reduced beam dispersion compared to the Prior Art.

FIG. 10 shows details of a particular embodiment of the invention utilizing a RV extender and two Micromasks in a 14.5 inch diameter plasma discharge chamber. The RV was an 8.5 inch diameter vessel. The prototype RV extender, seen in shading, was fabricated from flat (0.030" thick) Aluminum sheet in a horseshoe shape, as shown. The flat side was affixed to the bottom of the RV. The outer radius of the extender 606 exceeded the diameter of the RV cylinder by up to 1.25 inch in an asymmetric pattern. Two "hole diameter and acceleration length tuning" Micromasks, 602 and 604, of the indicated sizes, were affixed to the 0.040" thick Molybdenum screen grid used in the Low Divergence grid set. Each micromask covered a specific number of grid holes. Mask 602 covered 34 holes, Mask 604, 22 holes. The micromasks were fabricated from 0.004" thick Tantalum foil. The holes in the two micromasks were all drilled to 96% of the diameter of the holes in the underlying grid assembly.

In yet another embodiment of the invention, the plasma uniformity can be more readily controlled if a second re-entrant rf coil is inserted into the plasma, the current to this coil can be optimized with respect to the current to the outer rf coil. This is shown schematically in FIG. 12. Common features of this Fig. and FIG. 1, are marked by common numbers, incremented by 600. New features comprise: the outer rf coil corresponding to 110 is labeled 710*a* and its corresponding power supply and matching system 109 is labeled 709*a*, and a second rf coil labeled 710*b* is mounted inside the re-entrant vessel 703*a* as shown, which has a second rf power supply and matching system labeled 709*b*. In addition, the outer coil has an optional rf flux concentrator 785*a*, corresponding to 185, and there is also an option inner rf flux concentrator 785*b*. The rf power to each rf coil is regulated by a controller 740, to conditions that provide optimum plasma uniformity, beam uniformity, efficiency, etc. The position of the rf coil can be optimized independently of the position of the RV.

It is possible also to energize both rf coils 710*a* and 710*b* with the same rf power supply, and also use the same rf matching system, given adjustment of the relative impedance of the two coils, as is known in the art. This would reduce the independence of the control circuit, however provide significantly reduced cost.

The above-described design would increase the plasma density in the "doughnut" shaped region 708 in between the rf coil and the RV. This can enhance the plasma density in an intermediate zone between the outer wall and the center of the discharge chamber.

Figure 13:
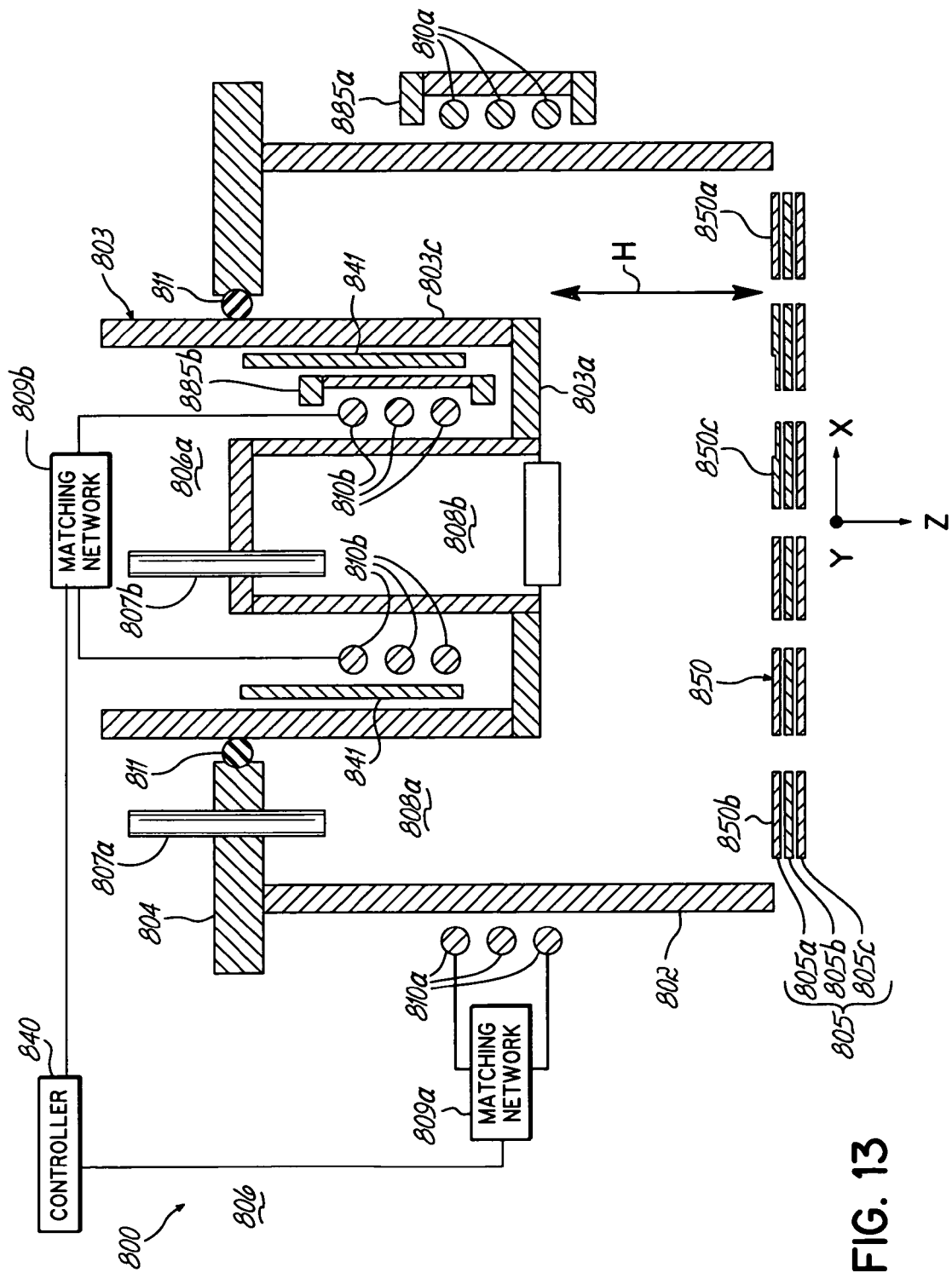
FIG. 13 is a cross-sectional view of another alternative embodiment of a chamber in which the re-entrant vessel includes a coil and magnetic field shaping structures.

Another embodiment is shown in FIG. 13. Common features of this Figure and FIG. 1 are marked by common numbers, incremented by 700. In this configuration, a second quartz chamber and gas supply is inserted into the RV, which can generate high density plasma in the central region 808*b*. RF coupling to the outer perimeter of the RV 808*a* is avoided by placement of a metallic shield 841 between the rf coil and the wall of the RV 803*c*. Other features of this embodiment are analogous to the same features shown in FIG. 12, the feature number being incremented by 100.

Figure 14:
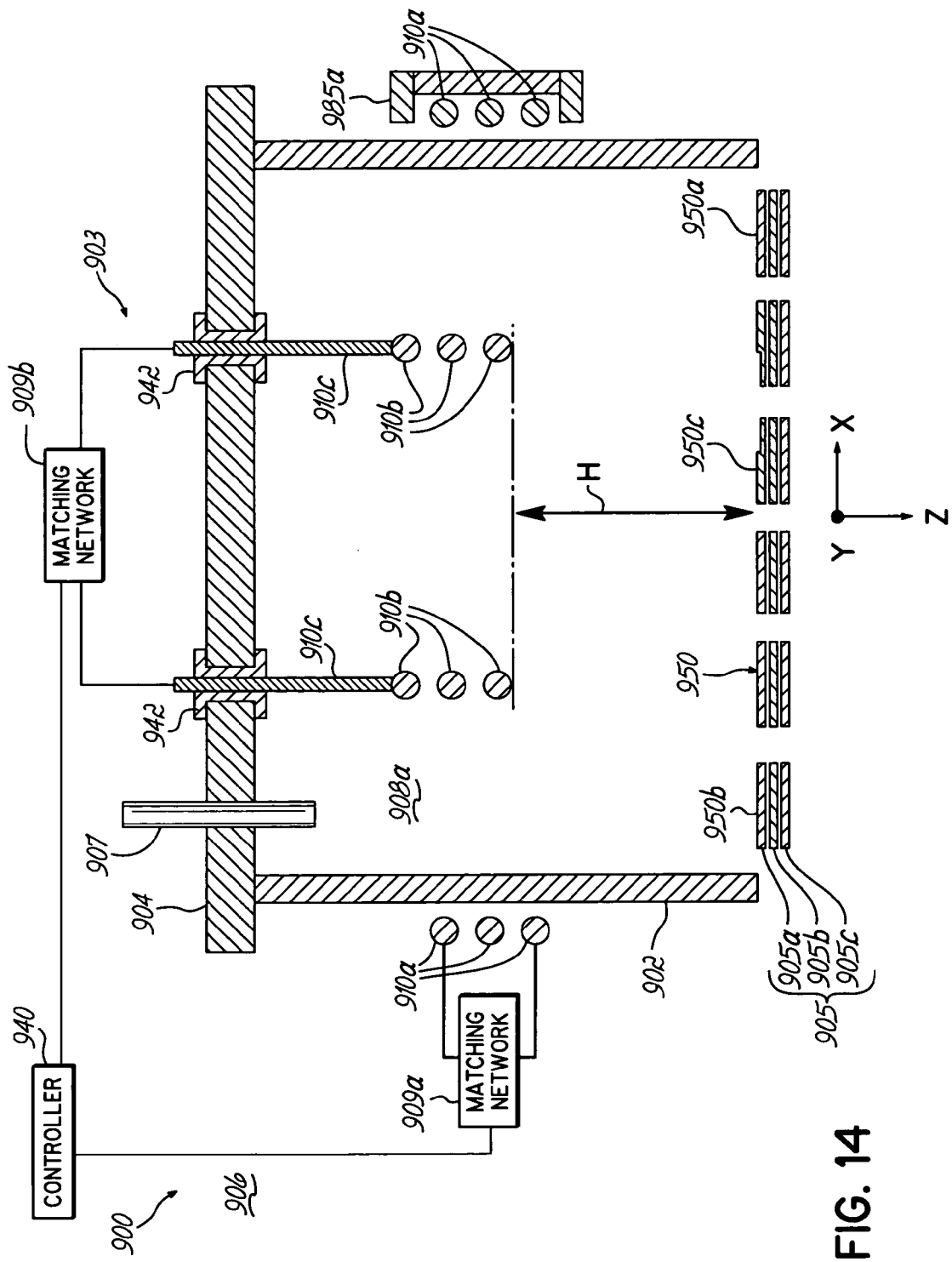
FIG. 14 is a cross-sectional view of another alternative embodiment in which a coil is suspended within the chamber without the use of a re-entrant vessel.

Still another configuration that would also tend to have a net effect of increasing plasma density in the center of the plasma discharge is shown in FIG. 14. Here, instead of a re-entrant vessel, a second, inner rf coil 910*b* is inserted into the plasma, and operated in addition to the outer rf coil 910*a*. The inner coil has two leg sections 910*c* that penetrate one wall of the discharge chamber, such as the top plate 904 through high vacuum feedthroughs 942. Either top plate 904, or the feedthrough itself, is an electrical insulator. Other features are analogous to the same features shown in FIG. 12, the feature number being incremented by 200. Inner rf coil 910*b*, which is in contact with the plasma, would have a dielectric coating such as porcelain or other dielectric material.

Figure 15:
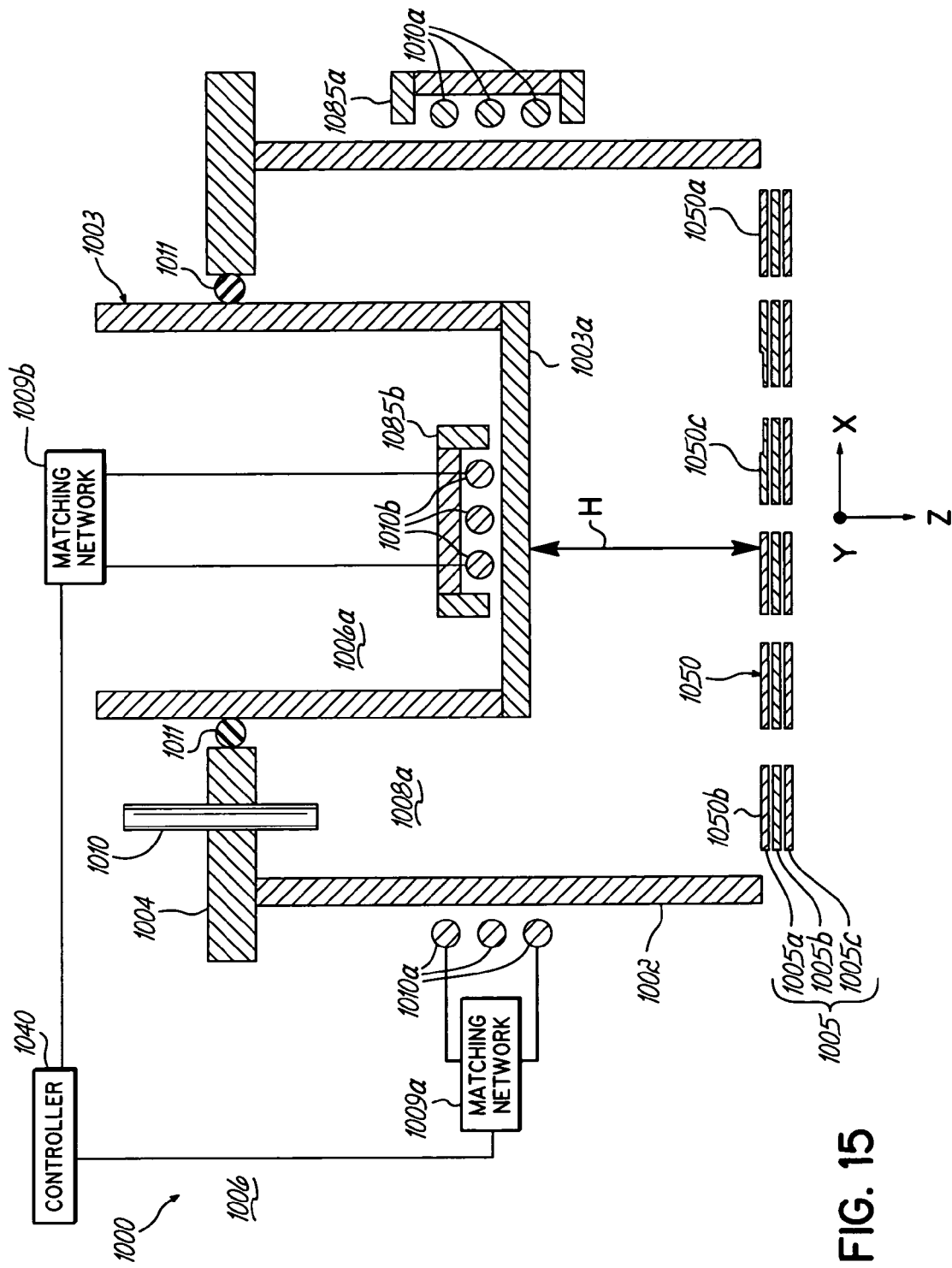
FIG. 15 is a cross-sectional view of another alternative embodiment in which a coil and magnetic field shaping structures are included in a re-entrant vessel.

Still another embodiment of the dual rf coil configuration is shown in FIG. 15. Here again an rf coil is inserted in a RV. Said inner coil 1010b is configured in a planar ("stovetop") design known in the art, and is adjacent to bottom surface 1003a of the RV. In this case 1003a must be fabricated from a dielectric material. Other features are analogous to the same features shown in FIG. 12, the feature number being incremented by 300.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A plasma processing apparatus, comprising:
   an evacuated chamber for containing a plasma,
   a radio frequency source for exciting said plasma using radio frequency energy, and
   a re-entrant vessel positioned within the chamber to shape and make more uniform said plasma contained within the chamber,
   wherein the re-entrant vessel is movable within the chamber in at least a first direction to adjust the plasma uniformity, and the re-entrant vessel includes extensions of adjustable shape or position, which is altered to further adjust and unify said plasma within said chamber.

2. The apparatus of claim 1, further comprising a radio frequency emitting coil within said re-entrant vessel.

3. The ion source of claim 1 further comprising an optical grid within the chamber having a plurality of apertures, ions from the plasma passing through said apertures of said optical grid.

4. An ion source for bombarding a substrate, comprising
   an evacuated chamber for containing a plasma,
   an optical grid within the chamber having a plurality of apertures, ions from the plasma passing through said apertures of said optical grid to bombard said substrate,
   a radio frequency source for exciting said plasma using radio frequency energy,
   a re-entrant vessel, positioned within the chamber to shape and make more uniform said plasma contained within the chamber,
   one or more magnets, positioned within the re-entrant vessel, and
   an actuator for moving said magnets.

5. The apparatus of claim 1 or 4 wherein said re-entrant vessel is not evacuated.

6. The ion source of claim 4 wherein the re-entrant vessel is movable within the chamber in at least a first direction to adjust the plasma uniformity.

7. The ion source of claim 4 wherein the re-entrant vessel includes extensions of adjustable shape or position, which is altered to further adjust and unify said plasma within said chamber.

8. The ion source of claim 4 further comprising a radio frequency emitting coil within said re-entrant vessel.

* * * * *